United States Patent [19]

Wani et al.

[11] Patent Number: 5,050,174
[45] Date of Patent: Sep. 17, 1991

[54] LASER DEVICE

[75] Inventors: Koichi Wani; Yasuhiro Shimada; Hidehito Kawahara; Mutsumi Mimasu; Tadaaki Miki, all of Osaka, Japan

[73] Assignee: Matsushita Electric Industrial Co., Ltd., Osaka, Japan

[21] Appl. No.: 480,152

[22] Filed: Feb. 14, 1990

[30] Foreign Application Priority Data

| Feb. 14, 1989 | [JP] | Japan | 1-33999 |
| Sep. 4, 1989 | [JP] | Japan | 1-228549 |
| Sep. 26, 1989 | [JP] | Japan | 1-249533 |
| Sep. 26, 1989 | [JP] | Japan | 1-249534 |
| Oct. 30, 1989 | [JP] | Japan | 1-282102 |

[51] Int. Cl.[5] .............................................. H01S 3/10
[52] U.S. Cl. ........................................ 372/20; 372/97; 372/108; 372/33
[58] Field of Search .................... 372/20, 99, 100, 102, 372/93, 97, 108, 92, 98, 33

[56] References Cited

U.S. PATENT DOCUMENTS 3,739,295   4/1972   Shah ...................................... 372/93

Primary Examiner—Frank Gonzalez
Assistant Examiner—Susan S. Morse
Attorney, Agent, or Firm—Pollock, VandeSande & Priddy

[57] ABSTRACT

A laser device includes an optical resonator comprising a laser medium and two totally reflecting mirrors disposed on respective sides of the laser medium. The laser device also has a wavelength selection element disposed between one of the totally reflecting mirrors and the laser medium. A partially reflecting mirror is disposed between the wavelength selection element and the laser medium. Any distortion and deterioration of the wavelength selection device are greatly reduced.

4 Claims, 6 Drawing Sheets

LASER DEVICE

BACKGROUND OF THE INVENTION

The present invention relates to a laser device for use as a light source in a protection-type exposure system.

Heretofore, light sources for emitting light beams to expose patterns for semiconductor integrated circuits have generally been high-pressure mercury lamps. A spectral line such as a g-line (436 nm) or an i-line (365 nm) of the radiation range of such a high-pressure mercury lamp has been used in the fabrication of LSI (large-scale integration) circuits. Fabricating SLSI (super-large-scale integration) circuits with much smaller patterns requires light sources which emit radiations of shorter wavelengths. One light source which can meet such a requirement is a laser beam source such as an excimer laser, for example. The excimer laser employs, as a laser medium, a mixture of a rare gas such as krypton or xenon and a halogen gas such as of fluorine or chlorine. The excimer laser can produce oscillation lines at a certain wavelength between 353 nm and 193 nm and with output powers which are large enough for pattern exposure.

The gain bandwidth of excimer lasers is broad, e.g., of about 1 nm. When an excimer laser is oscillated in combination with an optical resonator, its oscillation lines have a bandwidth (full width at half maximum) of about 0.5 nm. If a laser beam having such a relatively broad bandwidth is employed as an exposure light source, then the exposure optics used with the laser beam need to comprise a focusing optical system with corrected chromatic aberration, as is the case with an exposure light source in the form of a lamp. However, in an ultraviolet range whose wavelength is 350 nm or shorter, the chromatic aberration of the focusing optical system cannot fully be corrected since the available choice of optical materials for the lenses of the focusing optical system is limited.

If the bandwidth of oscillation lines of an excimer laser used in an exposure system can be reduced to about 0.005 nm for monochromatic laser emission, then it becomes possible to employ a focusing optical system with its chromatic aberration uncorrected. Therefore, the optical system of the exposure system is simplified, and the exposure system itself is reduced in size and cost.

In order to render a laser beam having a broad bandwidth monochromatic, the laser beam may be passed through a wavelength selection filter having a narrow passband. However, the wavelength selection filter greatly attenuates the output power of the laser, thus making it impossible to employ the laser as an exposure light source. One general solution has been to place a wavelength selection element within a resonator for making the laser beam monochromatic without attenuating the laser beam output power. FIG. 1 of the accompanying drawings shows such a conventional excimer laser having a narrow bandwidth. As shown in FIG. 1, a discharge tube 101 is placed in an optical resonator which comprises a totally reflecting mirror 102 and a partially reflecting mirror 104. The discharge tube 101 is filled with a medium gas that is composed of a mixture of a rare gas and a halogen gas, and that is excited by an electric discharge for laser oscillation. A wavelength selection element 105 which comprises a Fabry-Pérot etalon is disposed in the optical resonator. In the excimer laser of the illustrated arrangement, only a light beam having a certain wavelength which is selected by the Fabry-Pérot etalon 105 is amplified for laser oscillation. Therefore, the excimer laser can produce an output laser beam 106 having a highly narrow bandwidth and a high output power.

With the conventional laser device which has a narrow bandwidth, however, since a high-energy light beam present in the optical resonator passes through the wavelength selection element, the wavelength selection element tends to be distorted or deteriorated, resulting in a change in the selected wavelength or a drop in the laser output power. As a consequence, integrated circuits which are produced when the prior laser device is used as an exposure light source may become defective.

SUMMARY OF THE INVENTION

In view of the aforesaid problems of the conventional laser devices for use as exposure light sources, it is an object of the present invention to provide a laser device which is free from wavelength fluctuations and output power reductions which would otherwise be caused by distortion and deterioration of a wavelength selection element.

According to the present invention, there is provided a laser device comprising an optical resonator which includes a laser medium having an optical axis extending therethrough, a first totally reflecting mirror disposed on one side of the laser medium and extending perpendicularly to the optical axis, a second totally reflecting mirror disposed on another side of the laser medium which is different from the first totally reflecting mirror, a partially reflecting mirror disposed between the laser medium and the second totally reflecting mirror, and a wavelength selection element disposed between the partially reflecting mirror and the second totally reflecting mirror.

With this arrangement, the energy of a light beam that passes through the wavelength selection element is lowered to an extent which is in the order of the product of the energy and the transmittance of the partially reflecting mirror. Therefore, any distortion and deterioration of the wavelength selection element are greatly reduced.

If the reflectance or transmittance of the partially reflecting mirror is selected such that 40% or less of the light beam which goes from the laser medium to the partially reflecting mirror is applied to the wavelength selection element, then any distortion and deterioration of the wavelength selection element are minimized.

Of output light beams which are radiated out of the optical resonator from the partially reflecting mirror, the output light beam which is of a lower intensity may be utilized to detect the wavelength of the laser radiation without any output power loss.

The above and other objects, features and advantages of the present invention will become more apparent from the following description when taken in conjunction with the accompanying drawings in which preferred embodiments of the present invention are shown by way of illustrative example.

DETAILED DESCRIPTION

Figure 1:
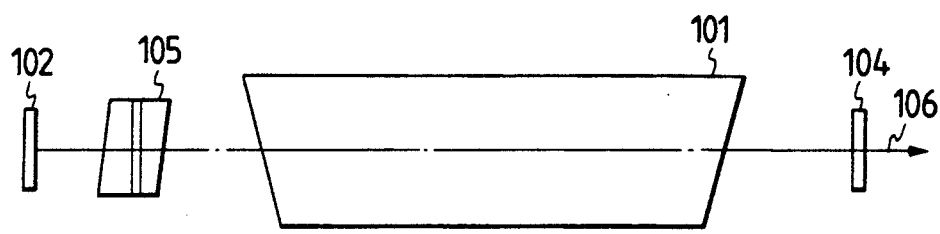
FIG. 1 is a schematic view of a conventional laser device.

Like or corresponding parts are denoted by like or corresponding reference numerals throughout views.

Figure 2:
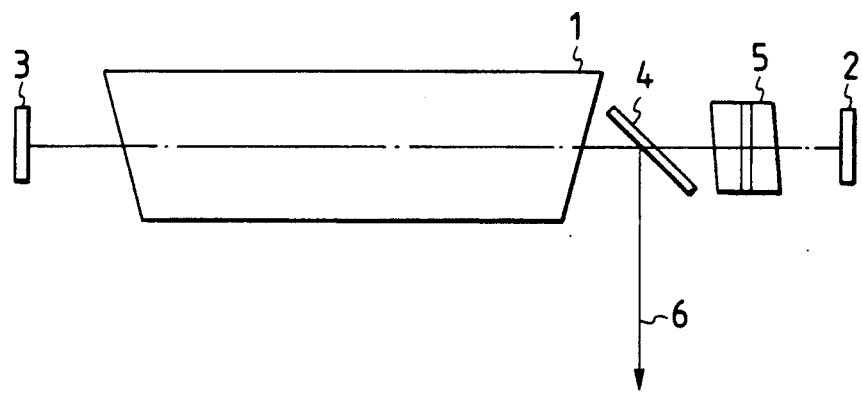
FIG. 2 is a schematic view of a laser device according to a first embodiment of the present invention.

FIG. 2 shows a laser device, which is in the form of an excimer laser, according to a first embodiment of the present invention. The laser device comprises an optical resonator which includes a discharge tube 1 filled with a laser medium that is a mixture of a rare gas and a halogen gas, and a pair of totally or fully reflecting mirrors 2, 3. The totally reflecting mirror 3 is disposed on one side of the discharge tube 1 and extends perpendicularly to the optical axis through the discharge tube 1, and the totally reflecting mirror 2 is disposed on the opposite side of the discharge tube 1 and also extends perpendicularly to the optical axis. The laser device is excited for laser oscillation in an ultraviolet radiation range. A partially reflecting or semireflecting mirror 4, which is positioned in the optical resonator, is disposed between the discharge tube 1 and the totally reflecting mirror 2, for directing an output laser beam perpendicularly to the optical axis of the optical resonator. The laser device also comprises a wavelength selection element 5 in the form of a Fabry-Pérot etalon which is disposed on the optical axis between the partially reflecting mirror 4 and the totally reflecting mirror 2. The Fabry-Pérot etalon 5 serves to select radiations of wavelengths in a particular narrow bandwidth and to return them to the discharge tube 1 to thereby amplify the output laser beam.

As with the conventional laser devices, a large optical energy is present in the portion of the optical resonator which extends between the totally reflecting mirror 3 and the partially reflecting mirror 4 and which also includes the discharge tube 1. However, any optical energy that exists in the space between the partially reflecting mirror 4 and the totally reflecting mirror 2 is small since most of the laser beam coming from the discharge tube 1 is radiated out of the optical resonator by the partially reflecting mirror 4. Therefore, if the transmittance of the partially reflecting mirror 4 is 20%, for example, then the optical energy that passes through the Fabry-Pérot etalon 5 is about 1/5 of the optical energy which passes through the Fabry-Pérot etalon 105 in the conventional laser device shown in FIG. 1. Consequently, the Fabry-Pérot etalon is prevented from being thermally distorted, deteriorated, and damaged, and it can select a certain wavelength stably over a long period of time.

Experiments conducted by the inventors indicated that when an output laser beam of 2 W was produced by the conventional excimer laser shown in FIG. 1, the Fabry-Pérot etalon was appreciably thermally distorted. As a result, the selected wavelength changed in a relatively short period of time. The reflectance of the reflecting coating of the Fabry-Pérot etalon was lowered or the reflecting coating itself was damaged, so that the laser beam pattern was adversely affected and the output laser power was reduced during usage for a long period of time.

The experimentation also showed that the Fabry-Pérot etalon of the laser device according to the present invention could operate without problems even when the output laser power was 5 W. Any appreciable deterioration and damage of the Fabry-Pérot etalon were seen during long usage. The bandwidth of the output laser beam was as narrow as the bandwidth of the conventional laser device.

Since the laser medium of the excimer laser has a high gain, the coupling ratio of the optical resonator, i.e., the transmittance of the partially reflecting mirror 4 in the laser device of the present invention, may be as low as 10% to 30%. Therefore, the present invention is particularly useful when embodied in an excimer laser.

Figure 3:
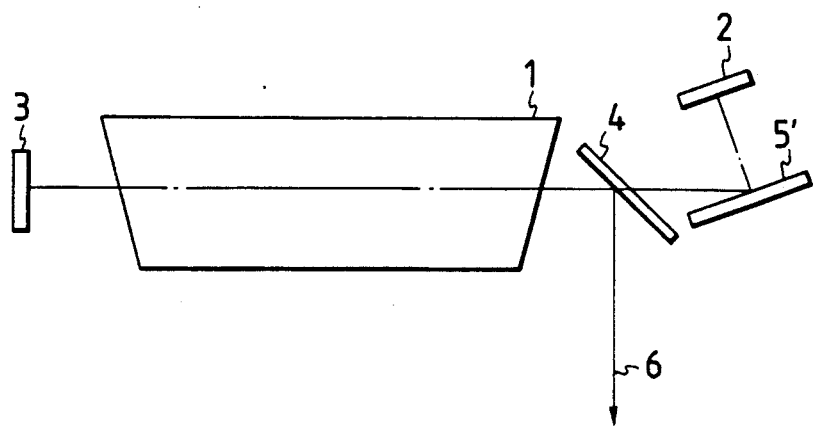
FIG. 3 is a schematic view of a laser device according to a second embodiment of the present invention.

A Fabry-Pérot etalon is damaged in operation because this optical element selects a wavelength through interference between two confronting reflecting surfaces thereof. More specifically, a high optical energy is confined between the two confronting reflecting surfaces by multiple reflections, so that the reflecting surfaces are easily damaged. If a wavelength selection element such as a grating which selects a wavelength through a single light reflection is employed, then the threshold value for damage will be several times higher than that of a Fabry-Pérot etalon. FIG. 3 shows a laser device according to a second embodiment of the present invention, the laser device including a grating 5' as a wavelength selection element. The use of the grating 5' makes it possible for the laser device to produce an output laser power of 10 W or higher. The wavelength selection element may instead be a prism.

Figure 4:
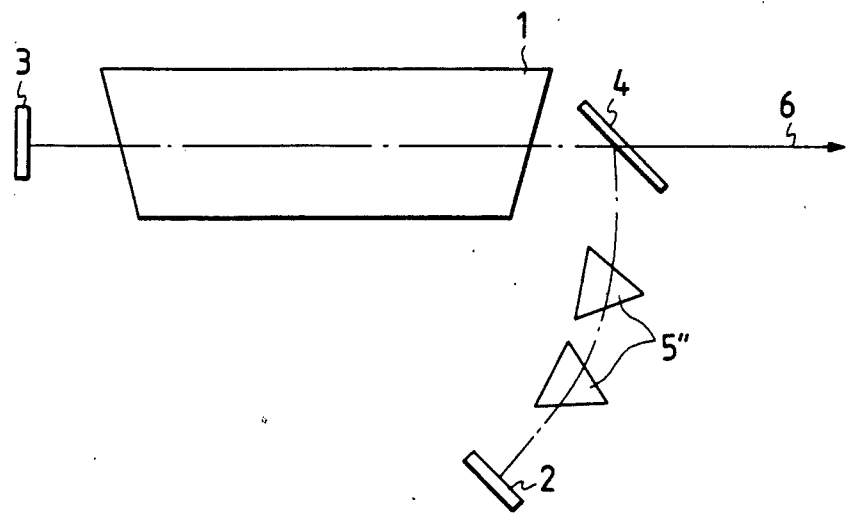
FIG. 4 is a schematic view of a laser device according to a third embodiment of the present invention.

FIG. 4 illustrates a laser device according to a third embodiment of the present invention. In FIG. 4, the totally reflecting mirror 2 is disposed on the optical axis which is bent by the partially reflecting mirror 4, and two wavelength selection elements 5", each in the form of a prism, are positioned between the partially reflecting mirror 4 and the totally reflecting mirror 2. If the reflectance of the partially reflecting mirror 4 is selected to be about 20%, then the laser device shown in FIG. 4 offers the same advantages as those of the laser device shown in FIG. 2. Instead of the prisms, Fabry- Pérot etalons, gratings, or the like may be employed as the wavelength selection elements 5.

With the above embodiments, as described above, a wavelength selection element is disposed in an optical resonator, and the energy of light passing through the wavelength selection element is reduced to reduce distortion and deterioration of the wavelength selection element. As a benefit, the selected wavelength is prevented from fluctuation, the output laser power is prevented from dropping, and hence a laser beam of a narrow bandwidth can stably be radiated.

Figure 5:
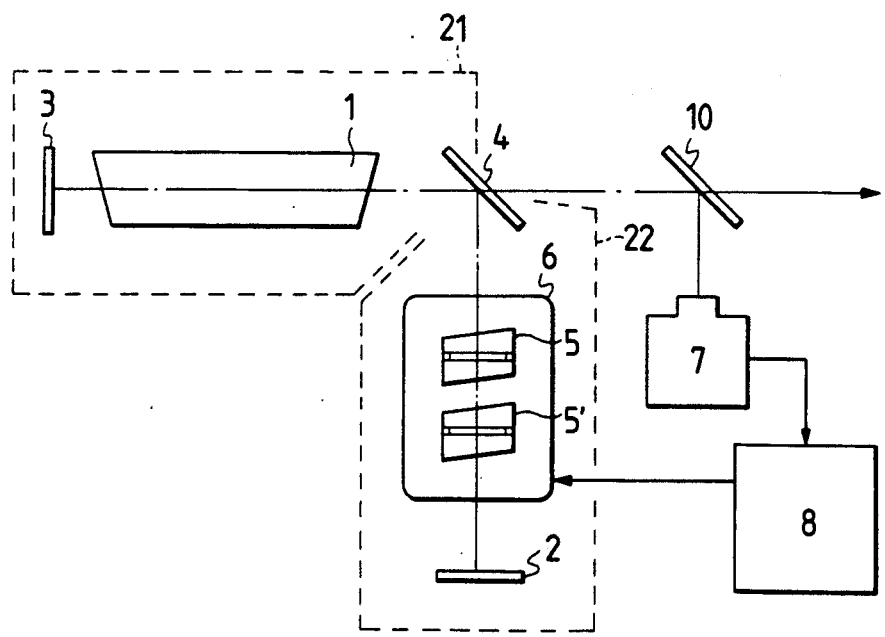
FIG. 5 is a schematic view of a laser device according to a fourth embodiment of the present invention.

FIG. 5 shows a laser device or excimer laser according to a fourth embodiment of the present invention. The laser device shown in FIG. 5 includes a wavelength selector 22 for selecting wavelengths in a certain narrow bandwidth. The wavelength selector 22 comprises a pair of etalons 5, 5' disposed on an optical axis between the partially reflecting mirror 4 and the totally reflecting mirror 2. The discharge tube 1 and the mirrors 3, 4 jointly constitute an optical amplifier 21. The discharge tube 1 is filled with a mixture of a rare gas and a halogen gas. The optical amplifier 21 and the wavelength selector 22 are optically coupled substantially perpendicularly to each other by the partially reflecting mirror 4. A monochromatic light beam selected by the wavelength selector 22 is amplified by the optical amplifier 21, and is emitted as a laser beam from the partially reflecting mirror along the optical axis of the optical amplifier 21. The etalons 5, 5' are disposed in a hermetically sealed chamber 6 in which the pressure can be regulated.

A beam splitter 10 is disposed on the optical axis which extends through the totally reflecting mirror 3 and the partially reflecting mirror 4. The beam splitter 10 extracts a portion of the output laser beam and applies it to a wavelength detector 7. The wavelength detector 7 compares the central wavelength of the laser beam with a reference value, and sends an error signal indicative of the difference between the compared wavelength values to a pressure controller 8. The pressure controller 8 then regulates the air pressure in the hermetically sealed chamber 6 so that the error signal will become zero. Thus, the central wavelength of the laser beam is always kept constant.

A large optical energy is present in the portion of the optical resonator which extends between the totally reflecting mirror 3 and the partially reflecting mirror 4 and which also includes the discharge tube 1. However, any optical energy that exists in the space between the partially reflecting mirror 4 and the totally reflecting mirror 2 is small since most of the laser beam coming from the discharge tube 1 is radiated out of the optical resonator by the partially reflecting mirror 4. Therefore, if the transmittance of the partially reflecting mirror 4 is 20%, for example, then the optical energy that passes through the etalons 5, 5' is about 1/5 of the optical energy which passes through the Fabry-Pérot etalon 105 in the conventional laser device shown in FIG. 1. Consequently, the etalons 5, 5' are prevented from being thermally distorted, and a single oscillation line can be maintained in the laser output wavelength range. The first etalon 5 has a very narrow bandwidth of 0.003 nm, but has adjacent transmission bands with an interval of some 0.03 nm, or the fineness of this etalon is 10. When such an etalon is employed solely in the resonator, the output beam of the laser has multiple lines because the gain bandwidth of the excimer laser is as broad as 1 nm. To select a single line out of these lines, the second etalon 5', which has a rather broad bandwidth of around 0.03 nm but has a single transmission band within the gain bandwidth of the excimer laser, is employed. The selected wavelength with these two etalons is so tuned that a single oscillation line is outputted from the laser.

Experiments conducted by the inventors showed that when an output laser beam of 2 W was produced by the conventional excimer laser, even if each etalon was adjusted for a single oscillation line, adjacent oscillation lines appeared due to a difference in wavelength drift between the etalons 5, 5' within a few minutes after the start of oscillation. The laser device of the invention however produced no plural oscillation lines even when the output laser power was 5 W. Furthermore, the central wavelength of the output laser beam could be kept constant when the air pressures in the gaps in the two etalons were simultaneously controlled in the single hermetically sealed chamber.

Since the laser medium of the excimer laser has a high gain, the coupling ratio of the optical resonator, i.e., the transmittance of the partially reflecting mirror 4 in the laser device of the above embodiment, may be as low as 10% to 30%. Therefore, the present invention is particularly useful when embodied in an excimer laser.

Figure 6:
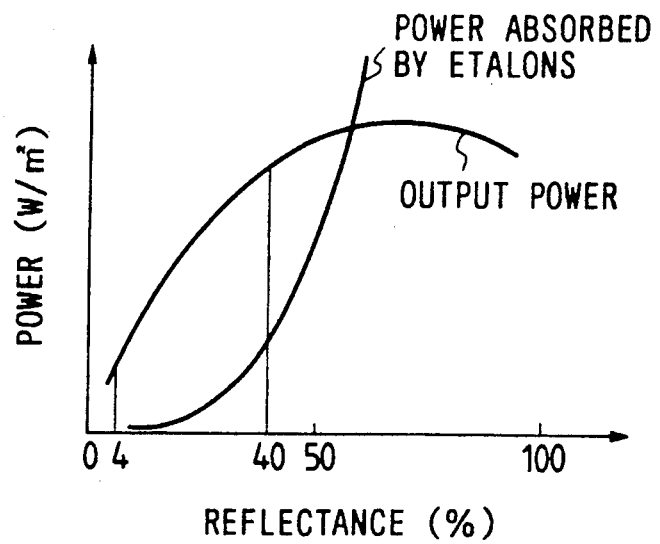
FIG. 6 is a diagram showing the relationship between the reflectance of a partially reflecting mirror and the output laser power and the power which is absorbed by etalons of the laser device shown in FIG. 5.

The inventors also conducted an experiment on the laser device according to the embodiment shown in FIG. 5 for the analysis of output laser powers. The experiment was carried out on a KrF excimer laser whose laser medium is a mixture of krypton and fluorine with helium used as a diluent gas. FIG. 6 shows measured output laser powers and powers absorbed by the etalons, estimated from the output laser powers, which are plotted against the reflectances of the partially reflecting mirror 4, according to the results of the experiment. In the arrangement shown in FIG. 5, the laser device produced laser oscillation when the reflectance of the partially reflecting mirror 4 was 4% or higher. When the reflectance of the partially reflecting mirror 4 was 40% or lower, the power absorbed by the etalons was lower than that of the conventional laser device, thus avoiding the generation of a plurality of oscillation lines.

As described above, since the laser beam power applied to the etalons is reduced by the partially reflecting mirror, the etalons are prevented from being thermally distorted, a plurality of oscillation lines are prevented from being generated, and hence a monochromatic laser beam of a constant wavelength can stably be radiated.

Figure 7:
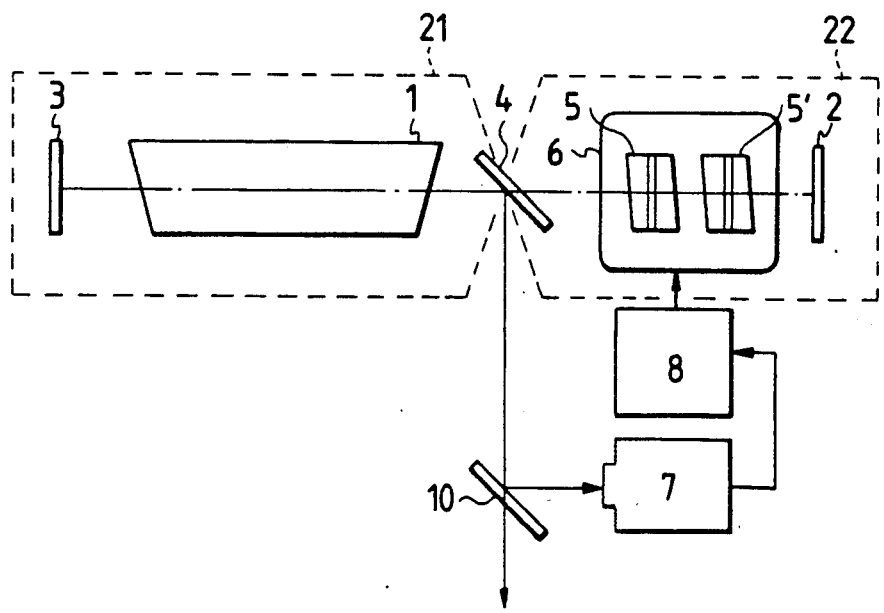
FIG. 7 is a schematic view of a laser device according to a fifth embodiment of the present invention.

FIG. 7 shows a laser device or excimer laser according to a fifth embodiment of the present invention. The laser device comprises a wavelength selector 22 for selecting wavelengths in a certain narrow bandwidth. The wavelength selector 22 comprises a pair of etalons 5, 5' disposed on an optical axis between the partially reflecting mirror 4 and the totally reflecting mirror 2, the optical axis being in line with the optical axis of the discharge tube 1 between the partially reflecting mirror 4 and the totally reflecting mirror 3. The discharge tube 1 is filled with a mixture of a rare gas and a halogen gas. The discharge tube 1 and the mirrors 3, 4 jointly constitute an optical amplifier 21. The optical amplifier 21 and the wavelength selector 22 are optically coupled to each other by the partially reflecting mirror 4. A monochromatic light beam selected by the wavelength selector 22 is amplified by the optical amplifier 21, and is emitted as a laser beam from the partially reflecting mirror 4 in a direction substantially normal to the optical axis of the optical amplifier 21 and the wavelength selector 22 The etalons 5, 5' are disposed in a hermetically sealed chamber 6 in which the pressure can be regulated.

A beam splitter 10 is disposed such that the output laser beam from the partially reflecting mirror 4 will pass therethrough. The beam splitter 10 extracts a portion of the output laser beam and applies it to a wavelength detector 7. The wavelength detector 7 compares the central wavelength of the laser beam with a reference value, and sends an error signal indicative of the difference between the compared wavelength values to a pressure controller 8. The pressure controller 8 then regulates the air pressure in the hermetically sealed chamber 6 so that the error signal will become zero. Thus, the central wavelength of the laser beam is always kept constant.

A large optical energy is present in the portion of the optical resonator which extends between the totally reflecting mirror 3 and the partially reflecting mirror 4 and which also includes the discharge tube 1. However, any optical energy that exists in the space between the partially reflecting mirror 4 and the totally reflecting mirror 2 is small since most of the laser beam coming from the discharge tube 1 is radiated out of the optical resonator by the partially reflecting mirror 4. Therefore, if the transmittance of the partially reflecting mirror 4 is 20%, for example, then the optical energy that passes through the etalons 5, 5' is about 1/5 of the optical energy which passes through the Fabry-Pérot etalon 105 in the conventional laser device shown in FIG. 1. Consequently, the etalons 5, 5' are prevented from being thermally distorted, and a single oscillation line can be maintained in the laser output wavelength range. The first etalon 5 has a very narrow bandwidth of 0.003 nm, but has adjacent transmission bands with an interval of some 0.03 nm, or the fineness of this etalon is 10. When such an etalon is employed solely in the resonator, the output beam of the laser has multiple lines because the gain bandwidth of the excimer laser is as broad as 1 nm. To select a single line out of these lines, the second etalon 5', which has a rather broad bandwidth of around 0.03 nm but has a single transmission band within the gain bandwidth of the excimer laser, is employed. The selected wavelength with these two etalons are so tuned that a single oscillation line is outputted from the laser.

Experiments conducted by the inventors showed that when an output laser beam of 2 W was produced by the conventional excimer laser, even if each etalon was adjusted for a single oscillation line, adjacent oscillation lines appeared due to a difference in wavelength drift between the etalons 5, 5' within a few minutes after the start of oscillation. The laser device of the invention however produced no plural oscillation lines even when the output laser power was 5 W. Furthermore, the central wavelength of the output laser beam could be kept constant when the air pressures in the gaps in the two etalons were simultaneously controlled in the single hermetically sealed chamber.

Since the laser medium of the excimer laser has a high gain, the coupling ratio of the optical resonator, i.e., the transmittance of the partially reflecting mirror 4 in the laser device of the above embodiment, may be as low as 10% to 30%. Therefore, the present invention is particularly useful when embodied in an excimer laser.

Figure 8:
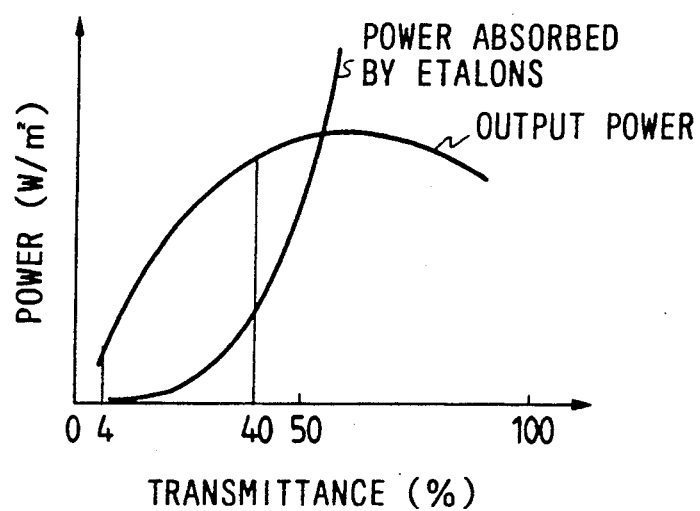
FIG. 8 is a diagram showing the relationship between the transmittance of a partially reflecting mirror and the output laser power and the power which is absorbed by etalons of the laser device shown in FIG. 7.

The inventors also conducted an experiment on the laser device according to the embodiment shown in FIG. 7 for the analysis of output laser powers. The experiment was carried out on a KrF excimer laser whose laser medium is a mixture of krypton and fluorine with helium used as a diluent gas. FIG. 8 shows measured output laser powers and powers absorbed by the etalons, estimated from the output laser powers, which are plotted against the reflectances of the partially reflecting mirror 4, according to the results of the experiment. In the arrangement shown in FIG. 7, the laser device produced laser oscillation when the reflectance of the partially reflecting mirror 4 was 4% or higher. When the reflectance of the partially reflecting mirror 4 was 40% or lower, the power absorbed by the etalons was lower than that of the conventional laser device, thus avoiding the generation of a plurality of oscillation lines.

As described above, since the laser beam power applied to the etalons is reduced by the partially reflecting mirror, the etalons are prevented from being thermally distorted, a plurality of oscillation lines are prevented from being generated, and hence a monochromatic laser beam of a constant wavelength can stably be radiated.

Figure 9:
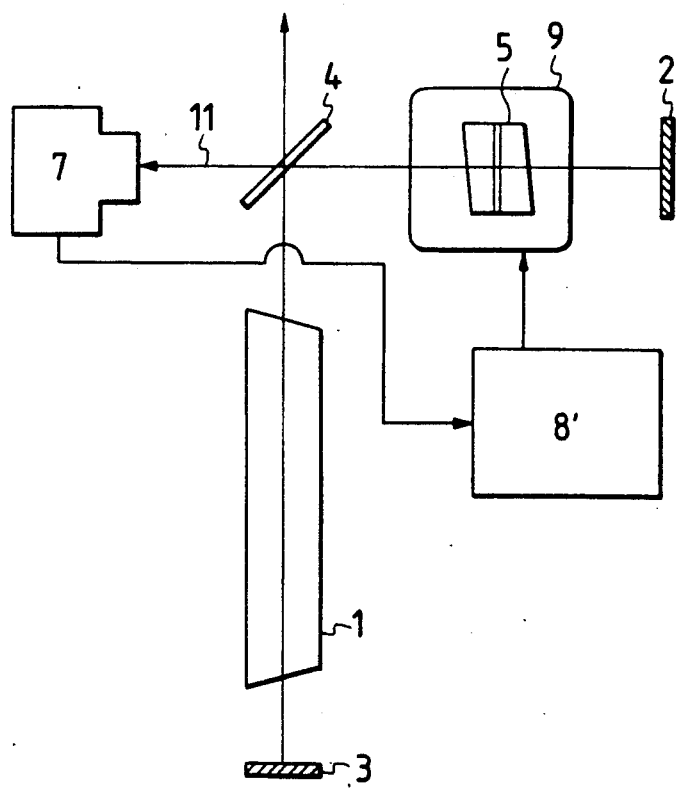
FIG. 9 is a schematic view of a laser device according to a sixth embodiment of the present invention.

FIG. 9 illustrates a laser device or excimer laser according to a sixth embodiment of the present invention. As shown in FIG. 9, the laser device comprises an optical resonator which includes a discharge tube 1 filled with a laser medium that is a mixture of a rare gas and a halogen gas, and a pair of totally reflecting mirrors 2, 3. The laser device also has a partially reflecting mirror 4. The partially reflecting mirror 4, which has a reflectance of several tens %, serves to bend the optical axis of the optical resonator toward the totally reflecting mirror 2 which is located off the optical axis interconnecting the discharge tube 1 and the totally reflecting mirror 3. The partially reflecting mirror 4 also serves to extract an output laser beam in the direction along the optical axis interconnecting the discharge tube 1 and the totally reflecting mirror 3. A wavelength selector 5, which comprises a Fabry-Pérot etalon, for selecting and amplifying wavelengths in a certain bandwidth, is disposed on the optical axis between the partially reflecting mirror 4 and the totally reflecting mirror 2. The Fabry-Pérot etalon 5 is housed in a hermetically sealed chamber 9.

A portion of the laser light prior to amplification is present as a weak monitor beam 11 on the optical axis between the totally reflecting mirror 2 and the partially reflecting mirror 4. The monitor beam 11 is applied to a wavelength detector 7 which measures the central wavelength thereof. A signal indicative of the measured wavelength is fed back to the Fabry-Pérot etalon 5 through a signal processor 8' so that the wavelength selected by the Fabry-Pérot etalon 5 is controlled to cause the laser device to oscillate always at a constant wavelength. The selected wavelength can be adjusted by varying the air pressure around the Fabry-Pérot etalon 5 in the chamber 9, as disclosed in Japanese Patent Application No. 62(1987)-243359. Alternatively, the wavelength selected by the Fabry-Pérot etalon 5 may be controlled by adjusting the angle of the Fabry-Pérot etalon 5 with respect to the optical axis on which it is disposed.

The wavelength of the monitor beam 11 is selected by the Fabry-Pérot etalon 5, and the wavelength of the output laser beam directly reflects the wavelength of the monitor beam 11. Therefore, the wavelength of the monitor beam 11 can be used to control the wavelength of the output laser beam. According to an experiment, irrespective of whether the selected wavelength was adjusted by varying the air pressure around or the angle of the Fabry-Pérot etalon 5, it was possible to keep any fluctuations of the central wavelength of the laser beam within ±0.001 nm by way of the wavelength control using the monitor beam 11.

The inventors also conducted an experiment on the laser device shown in FIG. 9 for the analysis of the output laser power. The results of the experiment indicated that the laser device of the present embodiment produced the same output laser power as a conventional laser device with a beam splitter omitted. Stated otherwise, the output laser power of the laser device of the present embodiment was higher than the output laser power of the conventional laser device with a beam splitter.

The laser device shown in FIG. 9 can produce a higher output laser power than the conventional laser device while at the same time extracting a wavelength detecting monitor beam, for the following reasons: the laser beam which has passed through the wavelength selection element 5 and has a narrow bandwidth of about 0.005 nm is directed by the partially reflecting mirror 4 back to the laser medium by which it is amplified. In the excimer laser, the gain of the laser medium is so high that the output laser beam is almost saturated. Therefore, even if a portion of the laser beam prior to amplification is extracted, the amplified output laser beam is not affected. On the other hand, the output laser power of the conventional laser device with beam splitter is reduced since a portion of the amplified laser beam is extracted for wavelength detection.

Figure 10A:
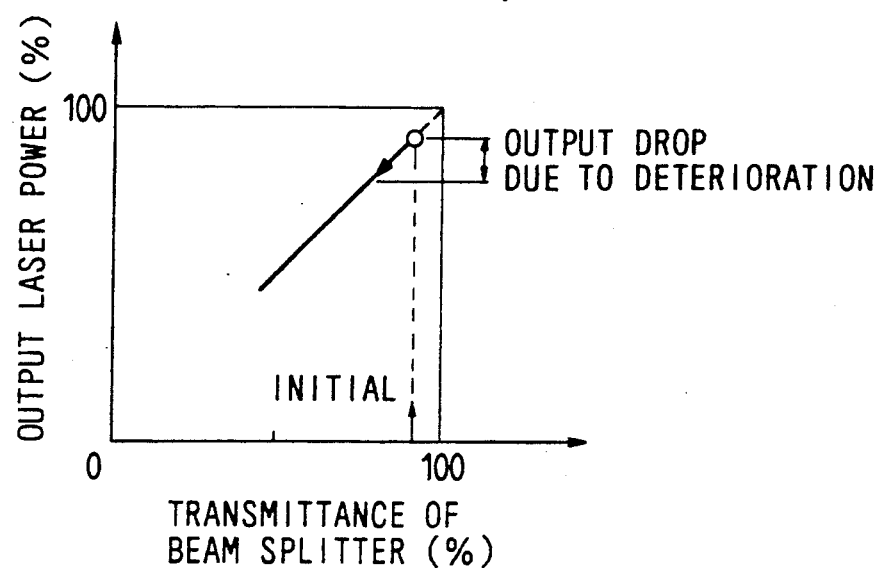
FIG. 10(a) is a diagram showing the relationship between the transmittance of a beam splitter and the output laser power of a conventional laser device.
Figure 10B:
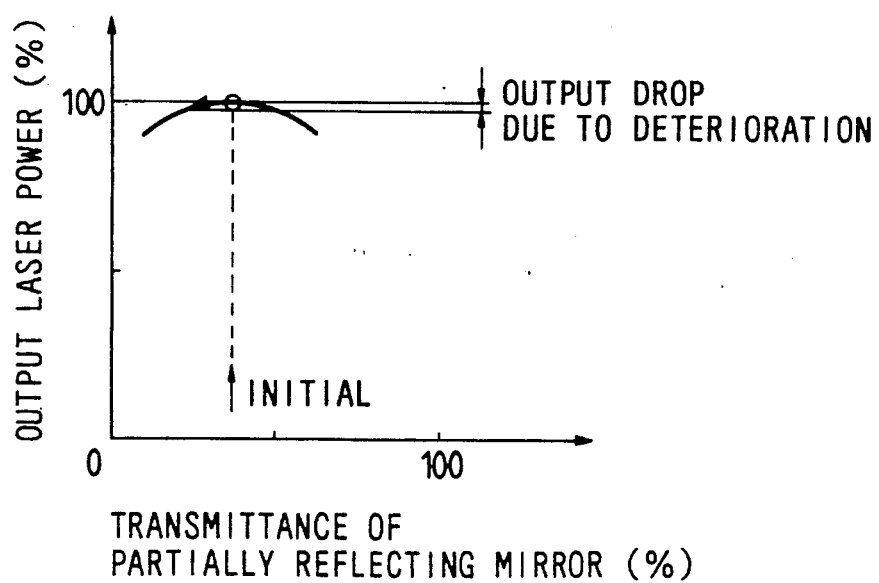
FIG. 10(b) is a diagram showing the relationship between the transmittance of a partially reflecting mirror and the output laser power of the laser device shown in FIG. 9.

The inventors also checked the output laser power for fluctuations over a long period of time. FIG. 10(a) illustrates the relationship between the transmittance of a beam splitter in a conventional laser device and the output laser power thereof. A study of FIG. 10(a) shows that the output laser power decreases in proportion to the transmittance of the beam splitter. FIG. 10(b) shows the relationship between the transmittance of the partially reflecting mirror 4 of the laser device according to the present embodiment and the output laser power. As shown in FIG. 10(b), even when the partially reflecting mirror 4 is degraded and its transmittance is lowered, the output laser beam is not greatly affected thereby. This is because the output laser power has its maximum level with respect to the transmittance of the partially reflecting mirror 4. Therefore, the output laser power of the laser device according to the present invention is not substantially reduced even when the transmittance of the partially reflecting mirror 4 is lowered due, for example, to any degradation of the material of the mirror 4 during usage.

Figure 11:
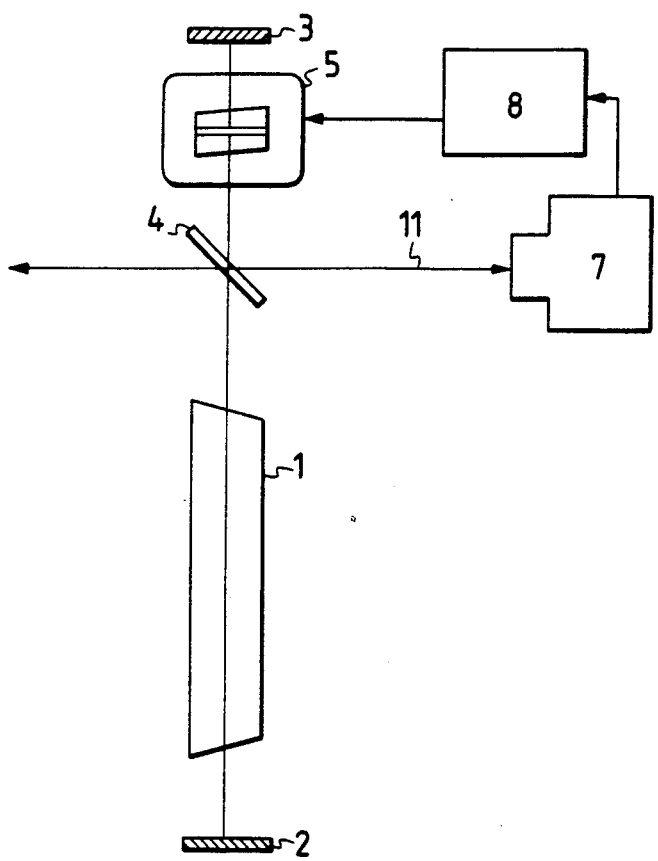
FIG. 11 is a schematic view of a laser device according to a seventh embodiment of the present invention.

FIG. 11 shows a laser device according to a seventh embodiment of the present invention. In FIG. 11, the totally reflecting mirrors 2, 3 are disposed on a straight optical axis, and the partially reflecting mirror 4 is disposed on the optical axis for extracting an output laser beam in a direction normal to the optical axis. A monitor beam 11 which is emitted in the opposite direction to the output laser beam is applied to the wavelength detector 7 for the same wavelength control as the laser device shown in FIG. 9.

According to the embodiment shown in FIG. 11, the single partially reflecting mirror serves to extract both the output laser beam and the monitor beam. The partially reflecting mirror does not cause an output power loss, and any output power drop due to deterioration thereof is reduced. The laser device shown in FIG. 11 can emit a laser beam at a stable wavelength, and is of optimum characteristics for use as an exposure light source.

Figure 12:
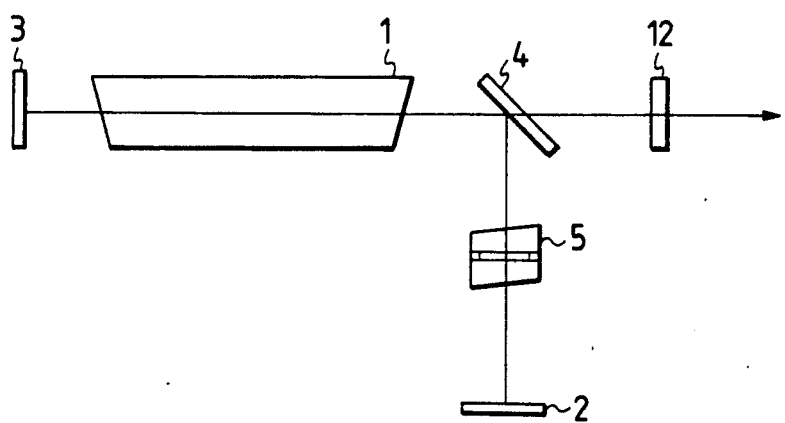
FIG. 12 is a schematic view of a laser device according to an eighth embodiment of the present invention.

FIG. 12 shows a laser device or excimer laser according to an eighth embodiment of the present invention. The laser device comprises an optical amplifier composed of a discharge tube 1 having a laser medium which is a mixture of a rare gas and a halogen gas and a totally reflecting mirror 3, and a wavelength selector composed of a Fabry-Pérot etalon 5 and a totally reflecting mirror 2, the optical amplifier and the wavelength selector being optically coupled perpendicularly to each other by a partially reflecting mirror 4.

A monochromatic light beam which is produced by the wavelength selector is returned by the partially reflecting mirror 4 to the optical amplifier by which it is amplified. The amplified light beam is then emitted as an output laser beam through the partially reflecting mirror 4.

With the arrangement shown in FIG. 12, most of the light coming from the discharge tube 1 is radiated out of the optical resonator from the partially reflecting mirror 4. Therefore, any optical energy present in the space between the partially reflecting mirror 4 and the totally reflecting mirror 2 is small, and hence any optical energy which is absorbed by the Fabry-Pérot etalon 5 is small. Therefore, the Fabry-Pérot etalon 5 is prevented from being largely distorted or damaged, and hence the laser device is prevented from having degraded output power characteristics. Since the optical axis of the optical resonator is bent by the partially reflecting mirror 4, the output laser beam is strongly polarized. This is because when the light beam is applied to the partially reflecting mirror 4 at an incident angle of 45°, the reflectance of a so-called S wave which has an electric field vector normal to a plane including the optical path, and S-polarized light is selectively amplified.

The above features enable the laser device shown in FIG. 12 to radiate a monochromatic excimer laser beam stably.

The light beam which is emitted from the discharge tube 1 and which travels toward the totally reflecting mirror 3 is amplified without being subjected to wavelength selection. Therefore, the monochromatic laser beam is mixed with a component of a certain proportion having a wide bandwidth. This component which has a wide bandwidth is called "ASE" (Amplified Stimulated Emission). The ASE must be removed as it is a background component which does not focus the pattern in a projection-type exposure system.

Figure 13A:
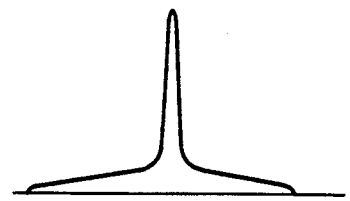
FIG. 13(a) is a diagram showing the spectrum of a laser beam before it is applied to a polarizer.

FIG. 13(a) shows the spectrum of a laser beam including ASE immediately after is has left the partially reflecting mirror 4.

The ASE is not polarized in view of the principles according to which it is generated. In the embodiment shown in FIG. 12, the laser beam from the partially reflecting mirror 4 is led to a polarizer 12 by which the ASE is removed from the output laser beam. The polarizer 12 is directed such that only the monochromatic component passes therethrough.

Figure 13B:
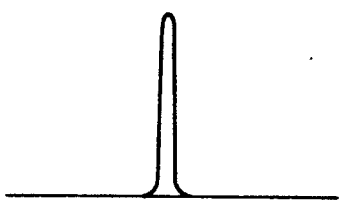
FIG. 13(b) is a diagram showing the spectrum of a laser beam after it has passed through a polarizer.

FIG. 13(b) shows the spectrum of a laser beam after it has passed through the polarizer 12.

Experimentation indicated that with the conventional arrangement, when the gain of the laser medium was increased for a greater output laser power, the ASE was also increased. If the output laser power of the conventional laser device was 2 W or more, the intensity of the ASE was 10% or more of the entire output laser power. According to the laser device of the embodiment shown in FIG. 12, however, the ASE was limited to 5% or less of the entire output laser power. It is also known from an exposure experiment that if the ASE was 5% or less of the entire output laser power, then a pattern could be projected by the output laser beam with a sufficient contrast.

With the embodiment shown in FIG. 12, as described above, the ratio of the monochromatic laser beam to the ASE is large. When the laser device of FIG. 12 is employed as an exposure light source, the laser device can emit an output laser beam in a narrow bandwidth, which can project high-quality patterns.

Although certain preferred embodiments have been shown and described, it should be understood that many changes and modifications may be made therein without departing from the scope of the appended claims.

What is claimed is:

1. A laser device comprising:
   an optical resonator which includes a laser medium having an optical axis extending therethrough, a first totally reflecting mirror disposed on one side of said laser medium and extending perpendicularly to said optical axis, and a second totally reflecting mirror disposed on another side of said laser medium;
   a partially reflecting mirror disposed between said laser medium and said second totally reflecting mirror, for outputting an output laser beam, which comprises a radiation propagating from said laser medium to said partially reflecting mirror, out of said optical resonator; and
   a wavelength selection element disposed between said partially reflecting mirror and said second totally reflecting mirror.

2. A laser device according to claim 1, wherein said laser medium and said first totally reflecting mirror jointly serve as an optical amplifier, and said wavelength selection element and said second totally reflecting mirror jointly serve as a wavelength selector, said optical amplifier and said wavelength selector being coupled to each other by said partially reflecting mirror such that the optical amplifier and the wavelength selector have intersecting optical axes, respectively, and wherein said partially reflecting mirror has a reflectance ranging from 4% to 40% with respect to light transmitted along the optical axis of said optical resonator.

3. A laser device according to claim 1, wherein said laser medium and said first totally reflecting mirror jointly serve as an optical amplifier, and said wavelength selection element and said second totally reflecting mirror jointly serve as a wavelength selector, said optical amplifier and said wavelength selector being linearly arranged with said partially reflecting mirror disposed therebetween, and wherein said partially reflecting mirror has a reflectance ranging from 4% to 40% with respect to light transmitted along the optical axis of said optical resonator.

4. A laser device according to claim 1, wherein said partially reflecting mirror also outputs a reference laser beam, which comprises a radiation propagating from said wavelength selection element to said partially reflecting mirror, out of said optical resonator, said laser device further including means for detecting the wavelength of said reference laser beam.

* * * * *

UNITED STATES PATENT AND TRADEMARK OFFICE
CERTIFICATE OF CORRECTION

PATENT NO. : 5,050,174

DATED : September 17, 1991

INVENTOR(S) : Koichi Wani, et al.

It is certified that error appears in the above-identified patent and that said Letters Patent is hereby corrected as shown below:

Column 1, line 6, change "protection: to --projection--.

Column 8, line 7, change "reflectances" to --transmittances--.

Column 8, line 10, change "reflectance" to --transmittance--.

Column 8, line 12, change "reflectance" to --transmittance--.

Column 12, line 25, change "reflectance" to --transmittance--.

Signed and Sealed this

Thirtieth Day of March, 1993

*Attest:*

STEPHEN G. KUNIN

*Attesting Officer*  *Acting Commissioner of Patents and Trademarks*